(12) United States Patent
Cumana Morales

(10) Patent No.: US 11,189,900 B2
(45) Date of Patent: Nov. 30, 2021

(54) TAPERED BROADBAND BALUN

(71) Applicant: Corning Research & Development Corporation, Corning, NY (US)

(72) Inventor: Jesús Anzoátegui Cumana Morales, Berlin (DE)

(73) Assignee: Corning Research & Development Corporation, Corning, NY (US)

( * ) Notice: Subject to any disclaimer, the term of this patent is extended or adjusted under 35 U.S.C. 154(b) by 210 days.

(21) Appl. No.: 16/690,625

(22) Filed: Nov. 21, 2019

(65) Prior Publication Data

US 2021/0159579 A1     May 27, 2021

(51) Int. Cl.
*H01P 5/02* (2006.01)
*H03F 3/34* (2006.01)
(Continued)

(52) U.S. Cl.
CPC .............. *H01P 5/02* (2013.01); *H01P 11/003* (2013.01); *H03F 3/345* (2013.01); *H05K 1/0242* (2013.01); *H05K 1/115* (2013.01); *H05K 3/4046* (2013.01); *H03F 2200/06* (2013.01); *H03F 2200/09* (2013.01); *H03F 2200/222* (2013.01); *H03F 2200/387* (2013.01); *H03F 2200/451* (2013.01); *H05K 2201/09827* (2013.01)

(58) Field of Classification Search
CPC .................................. H01P 5/02; H03F 3/345
See application file for complete search history.

(56) References Cited

U.S. PATENT DOCUMENTS 6,317,094 B1 * 11/2001 Wu ..................... H01Q 13/085
343/767
6,646,518 B2   11/2003 Tajima
(Continued)

FOREIGN PATENT DOCUMENTS

EP       2797168 B1    4/2019

OTHER PUBLICATIONS

Bah et al. "An extremely wideband tapered balun for application in tightly coupled arrays," 2016 IEEE-APS Topical Conference on Antennas and Propagation in Wireless Communications (APWC), Cairns, QLD, 2016, pp. 162-165.
(Continued)

*Primary Examiner* — Patricia T Nguyen
(74) *Attorney, Agent, or Firm* — C. Keith Montgomery

(57) ABSTRACT

A balun is disclosed and includes a dielectric substrate defining a first surface and a second surface. The balun includes a first output port including a first output ground portion and first output power portion; a second output port including a second output ground portion and a second output power portion; and an input port including an input ground portion and input power portion. The first output ground portion, the second output ground portion, and the input ground portion are coupled at a ground junction portion. The first output power portion, the second output power portion, and the input power portion are coupled at a power junction portion. The first output power portion, the second output power portion, and the input power portion are positioned on the first surface. The first output ground portion, the second output ground portion, and the input ground portion are positioned on the second surface.

21 Claims, 8 Drawing Sheets

(51) Int. Cl.
*H05K 1/11* (2006.01)
*H05K 1/02* (2006.01)
*H03F 3/345* (2006.01)
*H01P 11/00* (2006.01)
*H05K 3/40* (2006.01)

(56) References Cited

U.S. PATENT DOCUMENTS

| | | |
|---|---|---|
| 6,891,446 B2 | 5/2005 | Tayrani et al. |
| 7,994,874 B2 | 8/2011 | Tripp |
| 9,142,889 B2 * | 9/2015 | Pazin .................... H01P 5/028 |
| 2007/0001779 A1 * | 1/2007 | Asamura .................. H01P 5/10 333/26 |
| 2009/0295495 A1 * | 12/2009 | Liu .......................... H01P 5/10 333/26 |
| 2010/0182096 A1 * | 7/2010 | Kim ........................ H01P 5/10 333/26 |
| 2015/0288344 A1 * | 10/2015 | Poddar .................... H01P 5/10 333/26 |
| 2016/0226124 A1 * | 8/2016 | Fasenfest ................ H01P 5/185 |
| 2018/0026588 A1 * | 1/2018 | Nagasaku ............... H03F 1/483 330/295 |

OTHER PUBLICATIONS

Pozar, "Chapter 5: Impedance Matching and Tuning," in Microwave Engineering, 3rd edition, John Wiley & Sons, Inc. MA 2012, pp. 240-243.

Xia et al. "Design of a tapered balun for broadband arrays with closely spaced elements," IEEE Antennas and Wireless Propagation Letters vol. 8, 2009, pp. 1291-1294.

* cited by examiner

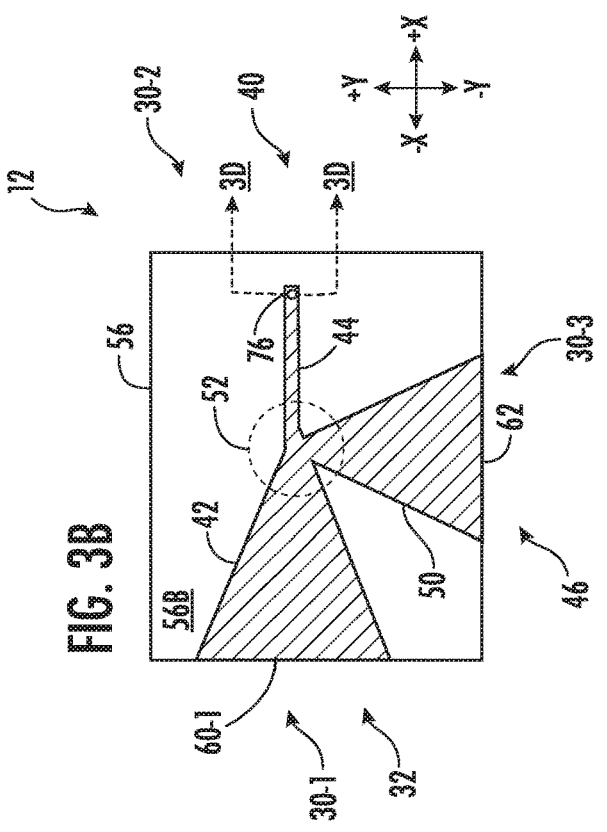
FIG. 3A
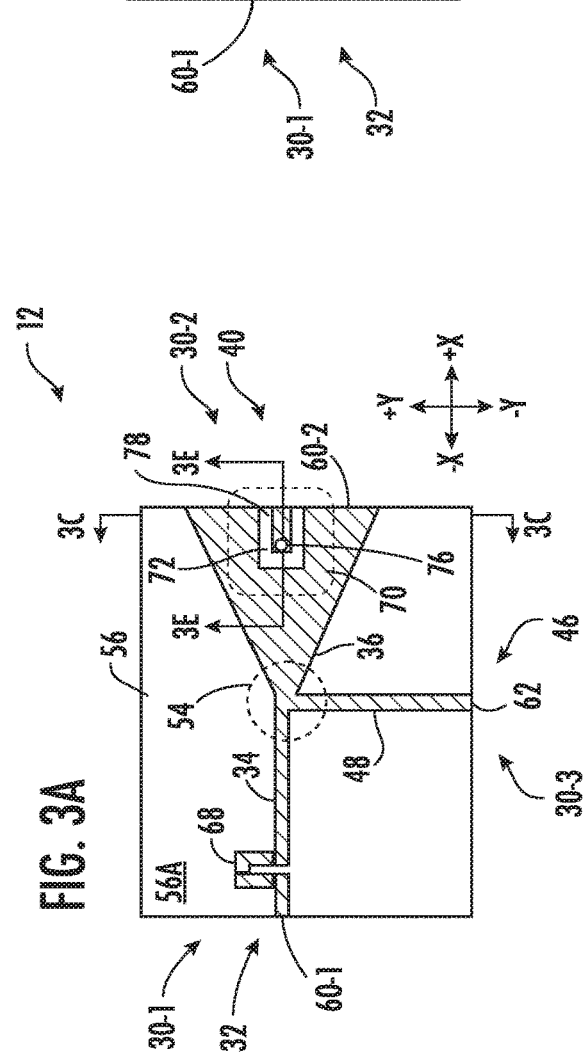
FIG. 3B
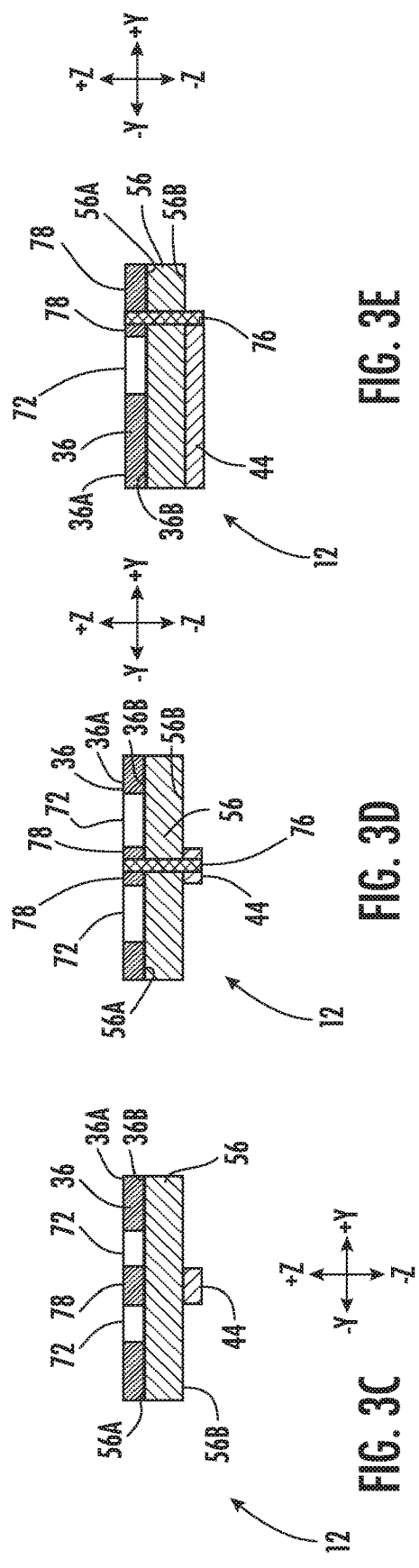
FIG. 3C
FIG. 3D
FIG. 3E

TAPERED BROADBAND BALUN

TECHNICAL FIELD

The present specification generally relates to baluns, and more particularly, a balun network including one or more tapered baluns.

BACKGROUND

A balanced-to-unbalanced circuit (hereinafter referred to as a "balun") generally includes a three-port electronic device configured to connect various types of electronic devices. As an example, a balun generally connects a balanced line (e.g., a line that has two conductors with equal currents in opposite directions, such as a twisted-pair cable or the like) to an unbalanced line (e.g., a line that has one conductor and a ground, such as a coaxial cable or the like). Baluns may be included in various electronic systems including, but not limited to, low-frequency audio systems, video systems, antenna systems, various radio frequency (RF) systems, and amplifier systems.

Baluns can also be configured to generate two signals at the output ports of the balun having approximately equal magnitude and a 180° phase difference. As an example, a voltage value of a first balanced output of the balun (e.g., 5V) may have an opposite magnitude of a voltage value of a second balanced output of the balun (e.g., −5V). A balun can also be configured to perform impedance transformation or matching functions in order to achieve maximum power transfer between two or more electronic devices, and the balun may be configured to reject particular harmonic distortions (e.g., even-order harmonics) of a balanced circuit.

SUMMARY

The present inventor has recognized that conventional baluns may have limited bandwidths in which they can efficiently operate. As an example, conventional baluns may be limited to a bandwidth of less than one octave with respect to a particular center frequency. As such, the limited bandwidth may make the conventional balun unsuitable for simultaneously supporting several wireless communication systems or for operation across multiple bands (e.g., 700 MHz, 850 MHZ, 1700 MHZ and 2600 MHz bands, which are used by long term evolution (LTE) telecommunication systems or the like), audio systems, and/or RF systems, which may operate over several octaves. Accordingly, the present inventors have recognized a need for baluns with enhanced operating bandwidths. The subject matter of the present disclosure addresses this need also presents embodiments where baluns may be integrated into multi-layer RF circuits and/or interfaced with circuitry having single-ended or unbalanced ports.

In one embodiment, a balun is disclosed and includes a dielectric substrate defining a first surface and a second surface opposite the first surface. The balun includes a first output port including a first output ground portion and first output power portion; a second output port including a second output ground portion and a second output power portion; and an input port including an input ground portion and input power portion. The first output ground portion, the second output ground portion, and the input ground portion are coupled at a ground junction portion. The first output power portion, the second output power portion, and the input power portion are coupled at a power junction portion. The first output power portion, the second output power portion, and the input power portion are positioned on the first surface. The first output ground portion, the second output ground portion, and the input ground portion are positioned on the second surface.

In another embodiment, an amplifier system is disclosed and includes an amplifier and a balun. The balun includes a dielectric substrate defining a first surface and a second surface opposite the first surface. The balun includes a first output port, a second output port, and an input port. The first output port includes a first output ground portion and first output power portion; the second output port includes a second output ground portion and a second output power portion; and the input port includes an input ground portion and input power portion. The first output ground portion, the second output ground portion, and the input ground portion are coupled at a ground junction portion. The first output power portion, the second output power portion, and the input power portion are coupled at a power junction portion. The first output power portion, the second output power portion, and the input power portion are positioned on the first surface. The first output ground portion, the second output ground portion, and the input ground portion are positioned on the second surface.

In yet another embodiment, a method of forming a balun includes forming a first output power portion, a second output power portion, an input power portion, and a power junction portion on a first surface of a dielectric substrate including the first surface and a second surface positioned opposite the first surface, wherein the power junction couples the first output power portion, the second output power portion, and the input power portion. The method includes forming a first output ground portion, a second output ground portion, an input ground portion, and a ground junction portion on the second surface, wherein the ground junction portion couples the first output ground portion, the second output ground portion, and the input ground portion. A width of the second output power portion increases from the power junction portion to an edge of the second output power portion. A width of the first output ground portion increases from the ground junction portion to an edge of the first output ground portion. A width of the input ground portion increases from the ground junction portion to an edge of the input ground portion.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

FIG. 3A schematically depicts a top view of another example balun network, according to one or more embodiments shown and described herein;

FIG. 3B schematically depicts a bottom view of the balun network of FIG. 3A, according to one or more embodiments shown and described herein;

FIG. 3C schematically depicts a cross-sectional view of the example balun network illustrated in FIGS. 3A-3B along section 3C-3C, according to one or more embodiments shown and described herein;

FIG. 3D schematically depicts another cross-sectional view of the example balun network illustrated in FIG. 3B along section 3D-3D, according to one or more embodiments shown and described herein;

FIG. 3E schematically depicts yet another cross-sectional view of the example balun network illustrated in FIG. 3A along section 3E-3E, according to one or more embodiments shown and described herein;

DETAILED DESCRIPTION

Referring to the figures, embodiments of the present disclosure are generally related to balun networks. In embodiments described herein, one or more tapered baluns may be connected and arranged such that a balanced port of each of the one or more tapered baluns are coupled via a junction portion. Furthermore, the ports of the one or more tapered baluns used to interface various electronic devices may be single-ended ports, as described below in further detail.

In embodiments described herein, the balun network may have a sufficient bandwidth (e.g., 1.5-2.2 octaves) at various center frequencies utilized in wireless communication systems (e.g., long term evolution (LTE) telecommunication systems or the like), audio systems, and RF systems, while maintaining a low amplitude balance (e.g., 0 dB, 1 dB, 2 dB, etc.), a low phase balance (e.g., 0° deviation from an optimal phase difference, 1° deviation from an optimal phase difference, 2° deviation from an optimal phase difference, etc.), and/or a large common-mode rejection ratio. Furthermore, by incorporating single-ended ports in the one or more tapered baluns of the balun network, the balun network can be easily connected and interfaced with various electronic devices.

Figure 1:
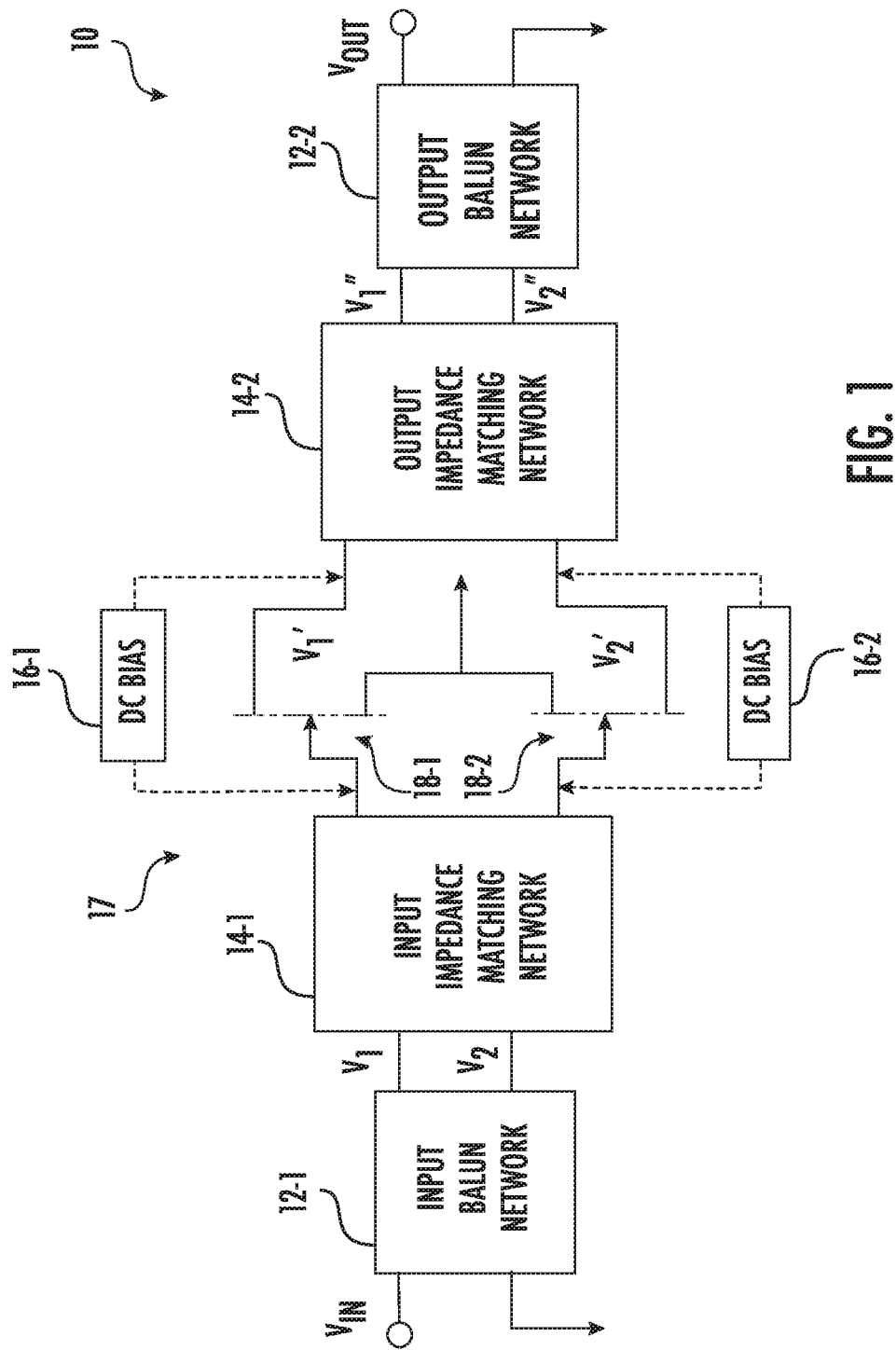
FIG. 1 schematically depicts a functional block diagram of an example amplifier system, according to one or more embodiments shown and described herein.

Referring now to FIG. 1, a functional block diagram of an amplifier system 10 is schematically depicted. In the embodiment illustrated in FIG. 1, the amplifier system 10 is a broadband push-pull power amplifier, however, it should be understood that the amplifier system 10 may include any suitable configuration.

As shown in the illustrated embodiment, the amplifier system 10 includes an input balun network 12-1 and an output balun network 12-2 (collectively referred to as balun networks 12); and an input impedance matching network 14-1 and an output impedance matching network 14-2 (collectively referred to as impedance matching networks 14). In embodiments, the amplifier system 10 includes a first direct current (DC) bias supply 16-1 and a second DC bias supply 16-2 (collectively referred to as DC bias supplies 16); and an amplifier 17, which includes a first transistor 18-1 and a second transistor 18-2 (collectively referred to as transistors 18).

In embodiments, the input balun network 12-1 splits an RF signal ($V_{IN}$) received at an input port of the input balun network 12-1 into a first signal ($V_1$) and a second signal ($V_2$). In some embodiments, the first signal ($V_1$) and the second signal ($V_2$) may have approximately the same magnitude and a phase difference of approximately 180°. The first signal ($V_1$) and the second signal ($V_2$) may then be provided to the input impedance matching network 14-1, which is configured to match an impedance of the output port of the input balun network 12-1 to an impedance of a gate or base terminal of the transistors 18. Without being bound by theory, matching the impedances may increase a power efficiency of the amplifier system 10 and decrease signal reflections of the amplifier system 10. As a non-limiting example, the input impedance matching network 14-1 may include at least one of a transformer, a resistor network, an inductor, a capacitor, and a transmission line configured to match the impedance of the output port of the input balun network 12-1 to the impedance of the gate or base terminals of the transistors 18.

The first signal ($V_1$) and the second signal ($V_2$) are then provided to the gate or base terminal of the transistors 18. The transistors 18 may be metal-oxide-semiconductor field-effect transistors (MOSFETs), however, it should be understood that in embodiments, the transistors 18 can be any suitable amplifying devices, such as bipolar-junction transistors (BJTs) or the like.

The transistors 18 are generally configured to amplify the first signal ($V_1$) and the second signal ($V_2$) and output a first amplified signal ($V_1'$) and a second amplified signal ($V_2'$) to the output impedance matching network 14-2. As a non-limiting example, a magnitude of the first amplified signal ($V_1'$) may be at least twice as large as the first signal ($V_1$), and a magnitude of the second amplified signal ($V_2'$) may be at least twice as large as the second signal ($V_2$), although other magnitudes are contemplated (e.g., twice as large, two and a half times as large, three times as large, etc.). In some embodiments, the DC bias supplies 16 may provide a DC voltage signal to the gate or base terminals and at least one of the source and drain terminals (or collector and emitter terminals) of the transistors 18. Accordingly, the transistors 18 can then be biased around a quiescent operating voltage of the transistors 18, thereby enabling the transistors 18 to amplify the first signal ($V_1$) and the second signal ($V_2$).

In some embodiments, the output impedance matching network 14-2 is configured to match an impedance of the output ports of the output balun network 12-2 to an impedance of the drain or collector terminals of the transistors 18 and output a first matched signal ($V_1''$) and a second matched signal ($V_2''$) based on the first amplified signal ($V_1'$) and the second amplified signal ($V_2'$), respectively. Without being bound by theory, matching the impedance of the output ports to an impedance of the drain or collector terminals of the transistors 18 may maximize the power transfer of the amplifier system 10 and minimize signal reflections of the amplifier system 10. As a non-limiting example, the output impedance matching network 14-2 may include at least one of a transformer, a resistor network, an inductor, a capacitor, and a transmission line configured to match the impedance of the output ports of the output balun network 12-2 to the impedance of the drain terminals of the transistors 18.

In embodiments, the output balun network 12-2 receives the first matched signal ($V_1''$) and the second matched signal ($V_2''$) using the output ports of the output balun network 12-2. By receiving the first matched signal ($V_1''$) and the second matched signal ($V_2''$) using the output ports, the output balun network 12-2 may subsequently combine the first matched signal ($V_1''$) and the second matched signal ($V_2''$) into an output signal ($V_{OUT}$). In some embodiments, the output signal ($V_{OUT}$) may have the same magnitude as the first matched signal ($V_1''$) and the second matched signal ($V_2''$) (i.e., double the power of the RF signal received at the input port of the input balun network 12-1 ($V_{IN}$)) and may have a phase difference of approximately 0°. Accordingly, the amplifier system 10 may generate an output signal ($V_{OUT}$) having at least double the power of the RF signal received at the input port of the input balun network 12-1 ($V_{IN}$). It should be understood that the magnitude of the output signal ($V_{OUT}$) may also be based on a gain of the transistors 18, an impedance of the various ports of the balun networks 12, and/or a voltage value of the RF signal ($V_{IN}$) in some embodiments.

While the embodiment illustrated in FIG. 1 illustrates the balun networks 12 implemented in the amplifier system 10, it should be understood that the balun networks 12 may be implemented in various other systems. In some embodiments, balun network 12 may be implemented in an antenna system (e.g., a differential antenna system). As a non-limiting example, the balun network 12 may be configured to enable balanced signals received by an antenna of the antenna system to be transmitted to an integrated circuit via a coaxial transmission cable, which may be an unbalanced system.

Figure 2A:
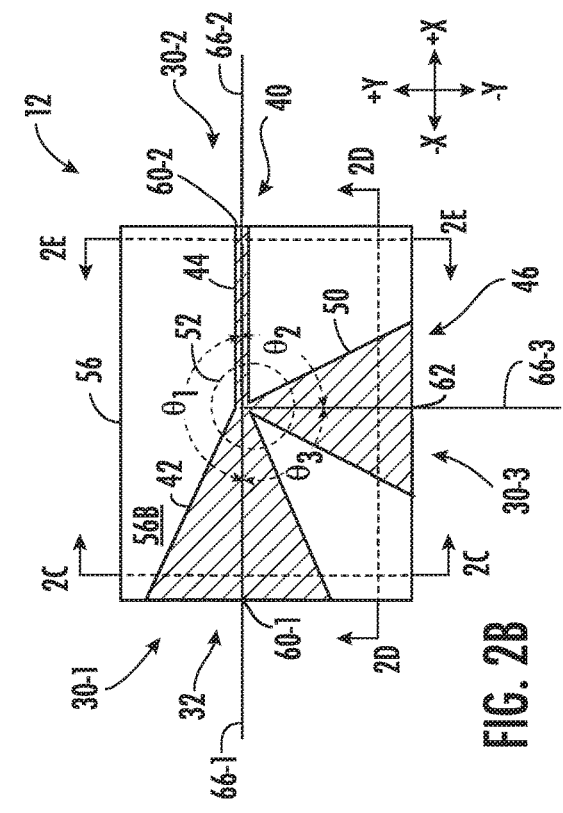
FIG. 2A schematically depicts a top view of an example balun network, according to one or more embodiments shown and described herein.
Figure 2B:
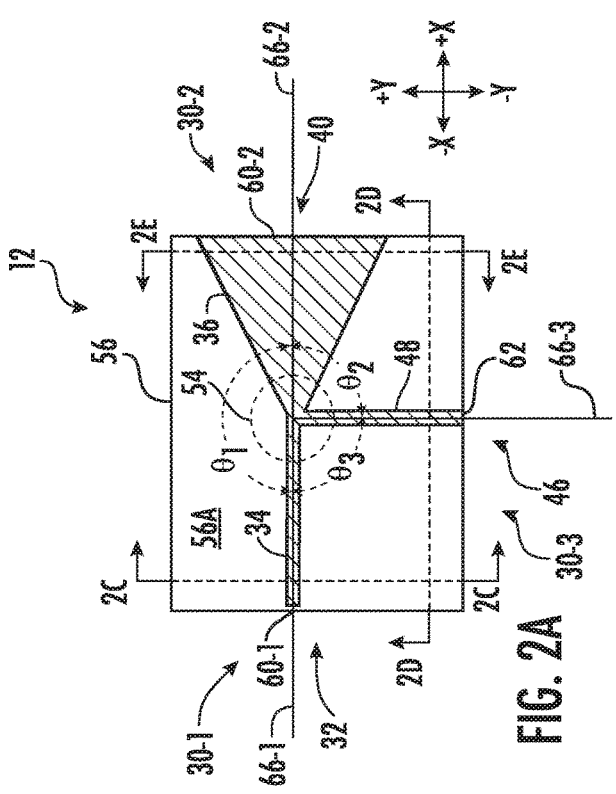
FIG. 2B schematically depicts a bottom view of the balun network of FIG. 2A, according to one or more embodiments shown and described herein.
Figure 2C:
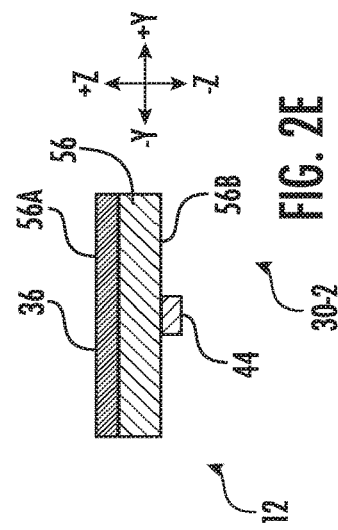
FIG. 2C schematically depicts a cross-sectional view of the example balun network illustrated in FIGS. 2A-2B along section 2C-2C, according to one or more embodiments shown and described herein.
Figure 2D:
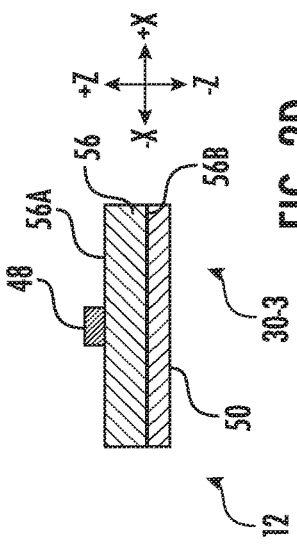
FIG. 2D schematically depicts another cross-sectional view of the example balun network illustrated in FIGS. 2A-2B along section 2D-2D, according to one or more embodiments shown and described herein.
Figure 2E:
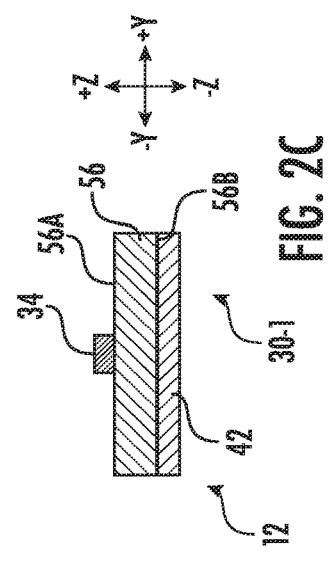
FIG. 2E schematically depicts another cross-sectional view of the example balun network illustrated in FIGS. 2A-2B along section 2E-2E, according to one or more embodiments shown and described herein.

With reference to FIGS. 2A and 2B, a top view and bottom view of one of the balun networks 12, respectively, are schematically depicted, and FIGS. 2C-2E depict section views of the balun network 12 along sections 2C-2C, 2D-2D, and 2E-2E, respectively. As shown in the illustrated embodiments, the balun network 12 includes a first tapered balun 30-1, a second tapered balun 30-2, and a third tapered balun 30-3 (collectively referred to as tapered baluns 30). In embodiments, the first tapered balun 30-1 includes a first output port 32, which includes a first output power portion 34 and a first output ground portion 42. The second tapered balun 30-2 includes a second output port 40, which includes a second output power portion 36 and a second output ground portion 44. In embodiments, the third tapered balun 30-3 includes an input port 46, which includes an input power portion 48 and an input ground portion 50. In embodiments, the first output ground portion 42, the second output ground portion 44, and the input ground portion 50 are electrically coupled at ground junction portion 52. Furthermore, the first output power portion 34, the second output power portion 36, and the input power portion 48 are electrically coupled at power junction portion 54.

In embodiments, the tapered baluns 30 may include a material that is configured to transmit a signal, such as an electrical, magnetic, or electromagnetic signal configured to travel through a medium, for example and without limitation a direct current (DC) signal, alternating current (AC) signal, sinusoidal-wave, triangular-wave, square-wave, and the like. Accordingly, the tapered baluns 30 may be formed of an electrically conductive material such as, copper, nickel, silver, gold, aluminum, tin, indium, bismuth, other similar metals or combinations thereof, and/or other metal alloys.

In embodiments, the tapered baluns 30 are positioned on at least one of a first surface 56A and a second surface 56B opposite of the first surface 56A of a dielectric substrate 56. In some embodiments the tapered baluns 30 are formed on the dielectric substrate 56 forming a direct bonded metal (DBM) substrate assembly (e.g., a direct bonded copper (DBC) substrate assembly). In embodiments, the dielectric substrate 56 may include any material that electrically insulates the first output power portion 34, the second output power portion 36, and the input power portion 48 from the first output ground portion 42, the second output ground portion 44, and the input ground portion 50. As a non-limiting example, the dielectric substrate 56 may be a ceramic substrate and may include alumina ($Al_2O_3$), aluminum nitride (AlN), beryllium oxide (BeO), silicon nitride (SiN), silicon carbide (SiC), other ceramic materials, or a glass-based material.

The tapered baluns 30 may be formed on the dielectric substrate 56 through any suitable method. As a non-limiting example, the tapered baluns 30 may be formed on the dielectric substrate 56 using an atomic layer deposition process, chemical vapor deposition, physical vapor deposition, electroless plating, film forming process, gas-metal eutectic bonding process, or other suitable processes. In embodiments, the tapered baluns 30 may be formed directly on the dielectric substrate 56 or may be formed on the dielectric substrate 56 via metallization layers (not shown). Example methods for forming the tapered baluns 30 on the dielectric substrate 56 are shown below in further detail with reference to FIG. 7.

In embodiments, the components of the tapered baluns 30 may be selectively positioned on at least one of the first surface 56A and the second surface 56B to electrically isolate particular components of the tapered baluns 30. In embodiments, the first output power portion 34 is positioned on the first surface 56A of the dielectric substrate 56, and the first output ground portion 42 is positioned on the second surface 56B of the dielectric substrate 56. Accordingly, the first output power portion 34 and the first output ground portion 42 may be electrically isolated from one another via the dielectric substrate 56.

In embodiments, the input power portion 48 is positioned on the first surface 56A of the dielectric substrate 56, and the input ground portion 50 is positioned on the second surface 56B of the dielectric substrate 56. Accordingly, the input power portion 48 and the input ground portion 50 may be electrically isolated from one another via the dielectric substrate 56.

As yet another non-limiting example in embodiments, the second output power portion 36 is positioned on the first surface 56A of the dielectric substrate 56, and the second output ground portion 44 is positioned on the second surface 56B of the dielectric substrate 56. Accordingly, the second output power portion 36 and the second output ground portion 44 may be electrically isolated from one another via the dielectric substrate 56.

While the embodiment depicted in FIGS. 2A and 2B depicts the first output power portion 34, the input power portion 48, and the second output power portion 36 as being positioned on the first surface 56A, and the first output ground portion 42, the input ground portion 50, and the second output ground portion 44 as positioned on the second surface 56B, it should be understood that the first surface 56A and the second surface 56B are arbitrarily defined surfaces of the dielectric substrate 56 that are electrically isolated from one another.

As used herein, the phrase "positioned on" can describe a spatial or functional relationship between two or more elements. Unless explicitly described as being "direct," the relationship can be a direct relationship where no other intervening elements are present between the first and second elements, but can also be an indirect relationship where one or more intervening elements are present (either spatially or functionally) between the first and second elements.

In some embodiments, the tapered baluns 30 may have various geometrical characteristics. As a non-limiting example and as illustrated in FIG. 2A, a width of the second output power portion 36 evaluated in the Y-direction as depicted increases moving outward from the power junction portion 54 to an edge 60-2 of the second output port 40. In particular, in the embodiment depicted in FIG. 2A, the width of the second output power portion 36 evaluated in the Y-direction may linearly increase moving outward from the power junction portion 54 to the edge 60-2 of the second output port 40. While the width of the second output power portion 36 is shown as linearly increasing in the illustrated embodiment, it should be understood that in some embodiments, the width of the second output power portion 36 may increase in a nonlinear manner from the power junction portion 54 to the edge 60-2 of the second output port 40 (e.g., an exponential increase, a parabolic increase, a plurality of step increases, or a combination thereof moving outward from the power junction portion 54 to the edge 60-2 of the second output port 40).

As illustrated in FIG. 2B, a width of the first output ground portion 42 evaluated in the Y-direction increases moving outward from the ground junction portion 52 to the edge 60-1 of the first output port 32. In embodiments and as illustrated in FIG. 2B, the width of the first output ground portion 42 evaluated in the Y-direction may linearly increase moving outward from the ground junction portion 52 to the edge 60-1 of the first output port 32. While the width of the first output ground portion 42 is shown as linearly increasing, it should be understood that in some embodiments, the width of the first output ground portion 42 may nonlinearly increase from the ground junction portion 52 to the edge 60-1 of the first output port 32 (e.g., an exponential increase, a parabolic increase, a plurality of step increases, or a combination thereof moving outward from the ground junction portion 52 to the edge 60-1 of the first output port 32).

In embodiments and as illustrated in FIG. 2B, the width of the input ground portion 50 evaluated in the X-direction may increase moving outward from the ground junction portion 52 to the edge 62 of the input port 46. In the embodiment illustrated in FIG. 2B, the width of the input ground portion 50 evaluated in the –X direction may linearly increase from the ground junction portion 52 to the edge 62 of the input port 46. While the input ground portion 50 is shown as linearly increasing, it should be understood that in some embodiments, the width of the input ground portion 50 may nonlinearly increase from the ground junction portion 52 to the edge 62 of the input port 46, respectively (e.g., an exponential increase, a parabolic increase, a plurality of step increases, or a combination thereof moving outward from the ground junction portion 52 to the edge 62 of the input port 46).

In embodiments and as illustrated in FIG. 2A, a width of the first output power portion 34 evaluated in the Y-direction as depicted may be approximately constant from the power junction portion 54 to an edge 60-1 of the first output port 32. Furthermore the width of the input power portion 48 evaluated in the X-direction as depicted may be approximately constant from the power junction portion 54 to an edge 62 of the input port 46. It should be understood that the width of the first output power portion 34 evaluated in the Y-direction may not be constant in some embodiments and may increase or decrease in the Y-direction. It should also be understood that the width of the input power portion 48 evaluated in the X-direction may not be constant in some embodiments and may increase or decrease in the X-direction.

In embodiments, the electrical pathways of the tapered baluns 30 may have various angular characteristics. For example and as illustrated in FIGS. 2A and 2B, a first angle ($\theta_1$) between a center line 66-1 of the first output port 32 of the first tapered balun 30-1 and a center line 66-2 of the second output port 40 of the second tapered balun 30-2 may be approximately 180°; a second angle ($\theta_2$) between a center line 66-3 of the input port 46 of the third tapered balun 30-3 and the center line 66-2 may be approximately 90°; and a third angle ($\theta_3$) between the center line 66-1 of the first output port 32 and the center line 66-3 of the input port 46 may be approximately 90°. In some embodiments, the first angle ($\theta_1$), the second angle ($\theta_2$), and the third angle ($\theta_3$) may have the same value (e.g., each of the first angle ($\theta_1$), the second angle ($\theta_2$), and the third angle ($\theta_3$) is 120°).

The balun network 12 described above with reference to FIGS. 2A-2E illustrates the first output port 32 and the second output port 40 as single-ended physical ports and as microstrip transmission lines (i.e., the first output power portion 34 and the second output power portion 36 are positioned on the first surface 56A of the dielectric substrate 56, and the first output ground portion 42 and the second output ground portion 44 are positioned on the second surface 56B of the dielectric substrate 56). Furthermore, the first output port 32 and the second output port 40 described above with reference to FIGS. 2A-2E are illustrated as asymmetrical transmission lines (i.e., the first output port 32 and the second output port 40 are unbalanced transmission lines). By connecting the first output port 32 and the second output port 40, which are asymmetrical transmission lines, the electric field lines of the first output port 32 and the second output port 40 are oriented in opposite directions. By connecting the input port 46, which is also illustrated as a single-ended physical port and a microstrip transmission line, to the first output port 32 and the second output port 40, the junction of the first output port 32 and the second output port 40 may transform a balanced signal received via the input port 46 to a single-ended signal (i.e., the balanced ports of each of the first output port 32, the second output port 40, and the input port 46 may be connected via one of the ground junction portion 52 and the power junction portion 54). As such, an electrical signal propagating through the input port 46 may be equally divided (i.e., a low amplitude balance, such as 0 dB, 1 dB, 2 dB, etc.) and outputted via the first output port 32 and the second output port 40. Moreover, the signals output via the first output port 32 and the second output port 40 may also have an opposite polarity (i.e., a low phase balance, such as 0° deviation from an optimal phase difference, 1° deviation from an optimal phase difference, 2° deviation from an optimal phase difference, etc.).

Furthermore, by selectively designating the geometric characteristics and angular characteristics described above, various operating characteristics of the balun network 12 may be optimized. In some embodiments, by selectively designating the first angle ($\theta_1$), the second angle ($\theta_2$), and the third angle ($\theta_3$), certain performance characteristics of the balun network 12 may be achieved. As a non-limiting example, the first angle ($\theta_1$), the second angle ($\theta_2$), and the third angle ($\theta_3$) may be selected to increase the common-mode rejection ratio (CMRR), decrease insertion losses (e.g., a power loss from an unbalanced portion to a balanced portion of the balun network 12), and improve return losses (i.e., power of a signal reflected/returned by the balun network 12). As another non-limiting example, the first angle ($\theta_1$), the second angle ($\theta_2$), and the third angle ($\theta_3$) may be selected to minimize signal reflections and thereby achieve certain performance characteristics of the balun network 12. In some embodiments, the input ground portion 50, the first output ground portion 42, and the second output power portion 36 may be tapered to convert differential mode signals to single-ended signals at the input port 46, the first output port 32, and the second output port 40, respectively.

In various embodiments, selecting the widths of at least one of the input power portion 48 of the input port 46, the first output power portion 34 of the first output port 32, and the second output power portion 36 of the second output port 40 may enable the balun network 12 to have predefined impedances for achieving optimal power efficiency over a wide frequency range (e.g., 1.5-2.2 octaves) while simultaneously maintaining a low amplitude balance (e.g., 0 dB, 1 dB, 2 dB, etc.) and a low phase balance (e.g., 0° deviation from an optimal phase difference, 1° deviation from an optimal phase difference, 2° deviation from an optimal phase difference, etc.), a high CMRR, and low insertion losses. As a non-limiting example, increasing the width of at least one of the input port 46, the first output port 32, and the second output port 40 may decrease the corresponding impedance. As another non-limiting example, decreasing the width of at least one of the input port 46, the first output port 32, and the second output port 40 may increase the corresponding impedance.

While the embodiments described above with reference to FIGS. 2A-2E illustrate the components of the tapered baluns 30 positioned on the first surface 56A as being electrically isolated from the components of the tapered baluns 30 positioned on the second surface 56B, it should be understood that in some embodiments, some of the components of the tapered baluns 30 positioned on the first surface 56A may not be electrically isolated from some of the components of the tapered baluns 30. As a non-limiting example and as described below with reference to FIGS. 3A-3E, the tapered baluns 30 may include one or more vias extending through the dielectric substrate 56 and including a conductive element 76 positioned therein to electrically couple some of the components positioned on the first surface 56A and some of the components positioned on the second surface 56B.

For example and referring to FIGS. 3A and 3B, a top view and bottom view of another example balun network 12, respectively, are schematically depicted. The balun network 12 illustrated in FIGS. 3A and 3B is similar to the balun network 12 illustrated in FIGS. 2A and 2B, but in this illustrated embodiment, the first output port 32 includes a protrusion portion 68 (i.e., a portion of the first output port 32 that extends outward in a vertical direction from the centerline 66-1 of the first output port 32). While the protrusion portion 68 is illustrated as vertically extending from the centerline 66-1 of the first output port 32 (e.g., in the Y-direction as depicted), it should be understood that protrusion portion 68 may extend outward from the centerline 66-1 of the first output port 32 at various orientations and may have various shapes (e.g., an arc shape, mitered edges, etc.). In some embodiments, the protrusion portion 68 is configured to further minimize the phase balance of the balun network 12.

Furthermore, in the illustrated embodiment of FIGS. 3A and 3B, the balun network 12 includes a coplanar waveguide portion 70. In some embodiments, the coplanar waveguide portion 70 includes a recess 72, a conductive element 76 positioned within a via (e.g., a through-hole via) of the dielectric substrate 56, and a center conductor portion 78. In some embodiments, the center conductor portion 78 is at least partially positioned within the recess 72. As shown in the illustrated embodiment of FIG. 3C (which is a partial cross-section view of the balun network 12 along section 3C-3C in FIG. 3A), the recess 72 may extend through the thickness of the second output power portion 36 from a first surface 36A to a second surface 36B. It should be understood that in some embodiments, the recess 72 may only partially extend through the second output power portion 36. It should also be understood that in some embodiments, the recess 72 may at least partially extend through the thickness of the dielectric substrate 56.

In some embodiments and as illustrated in FIG. 3D (which is a cross-section view of the balun network 12 along section 3D-3D in FIG. 3B) and FIG. 3E (which is a cross-section view of the balun network 12 along section 3E-3E in FIG. 3A), the conductive element 76 may extend through the thickness of the center conductor portion 78, the second output ground portion 44, and the dielectric substrate 56. Furthermore, the conductive element 76, which may be an electrically conductive metal, such as copper or the like may electrically couple the center conductor portion 78 to the second output ground portion 44. By electrically coupling the center conductor portion 78 to the second output ground portion 44, the components of the tapered baluns 30 that are positioned on the second surface 56B of the dielectric substrate 56 may function as a ground conductor of the balun network 12, and the components of the tapered baluns 30 (except for the center conductor portion 78) that are positioned on the first surface 56A of the dielectric substrate 56 may function as a non-ground (e.g., positive) conductor of the balun network 12.

Figure 4A:
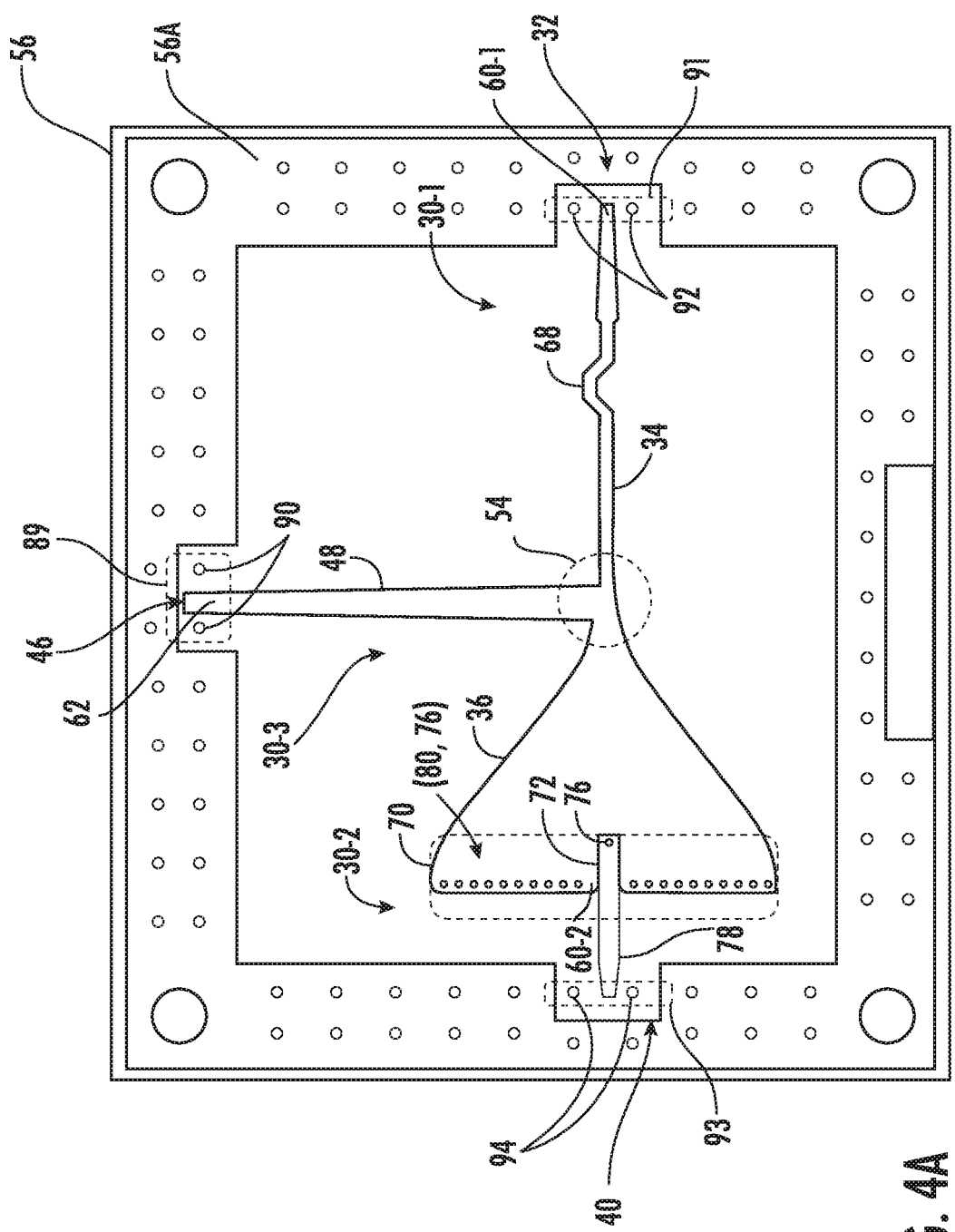
FIG. 4A schematically depicts a top view of yet another example balun network, according to one or more embodiments shown and described herein.
Figure 4B:
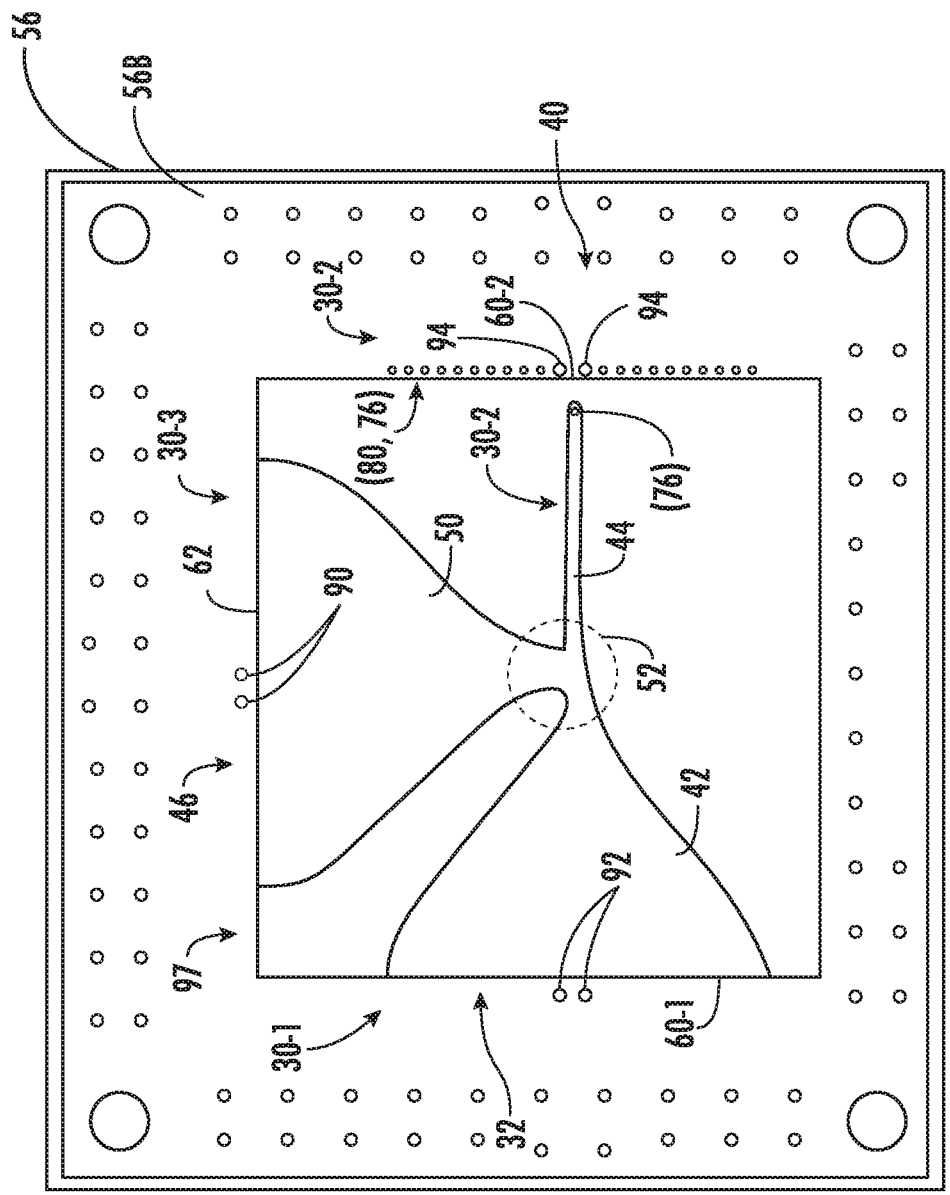
FIG. 4B schematically depicts a bottom view of the balun network of FIG. 4A, according to one or more embodiments shown and described herein.

With reference to FIGS. 4A and 4B, a top view and bottom view of another example balun network 12, respectively, are schematically depicted. The balun network 12 illustrated in FIGS. 4A and 4B is similar to the balun network 12 illustrated in FIGS. 3A and 3B, but in this illustrated embodiment, the balun network 12 includes a plurality of vias 80 positioned proximate to the edge 60-2 of the second output port 40. In some embodiments, the plurality of vias 80 may extend through the thickness of the second output port 40 and the dielectric substrate 56. Furthermore, each via of the plurality of vias 80 may include the conductive element 76 positioned therein to electrically couple the second output power portion 36 to a common ground 97 positioned on the second surface 56B of the dielectric substrate 56. By electrically coupling the second output power portion 36 to the common ground 97, the components of the tapered baluns 30 that are positioned on the second surface 56B of the dielectric substrate 56 may function as a ground conductor of the balun network 12, and the components of the tapered baluns 30 (except for the center conductor portion 78) that are positioned on the first surface 56A of the dielectric substrate 56 may function as a non-ground (e.g., positive) conductor of the balun network 12.

As shown in the illustrated embodiment of FIG. 4A, a width of the input power portion 48 of the input port 46 may decrease moving from the power junction portion 54 to the edge 62 of the input port 46. For example, in the embodiment depicted in FIG. 4A, the width of the input power portion 48 of the input port 46 linearly decreases moving from the power junction portion 54 to the edge 62 of the input port 46. While the width of the input power portion 48 is shown as linearly decreasing in the illustrated embodiments, it should be understood that in some embodiments, the width of the input power portion 48 may decrease in a nonlinear manner from the power junction portion 54 to the edge 62 of the input port 46 (e.g., a plurality of step decreases from the power junction portion 54 to the edge 62 of the input port 46, a parabolic decrease, and/or an exponential decrease). By tapering the input power portion 48, the impedance of the balun network 12 may be selected to achieve optimal power efficiency over a wide frequency range (e.g., 1.5-2.2 octaves) while simultaneously maintaining a low amplitude balance (e.g., 0 dB, 1 dB, 2 dB, etc.) and a low phase balance (e.g., 0° deviation from an optimal phase difference, 1° deviation from an optimal phase difference, 2° deviation from an optimal phase difference, etc.), a high CMRR, and high insertion losses.

In some embodiments and as illustrated in FIG. 4A, a coplanar waveguide portion 89 including a pair of coplanar input conductors 90, a coplanar waveguide portion 91 including a pair of first coplanar output conductors 92, and a coplanar waveguide portion 93 including a pair of second coplanar output conductors 94 may be positioned on the first surface 56A. Furthermore, the pair of coplanar input conductors 90, the pair of first coplanar output conductors 92, and the pair of second coplanar output conductors 94 may extend through an entirety of the dielectric substrate 56 (e.g., through a corresponding via) and may be electrically coupled to the common ground 97 of to the second surface 56B. As such, various components positioned on the first surface 56A may be grounded at the pair of coplanar input conductors 90, the pair of first coplanar output conductors 92, and/or the pair of second coplanar output conductors 94, such as the coplanar waveguide portion 70.

Figure 5:
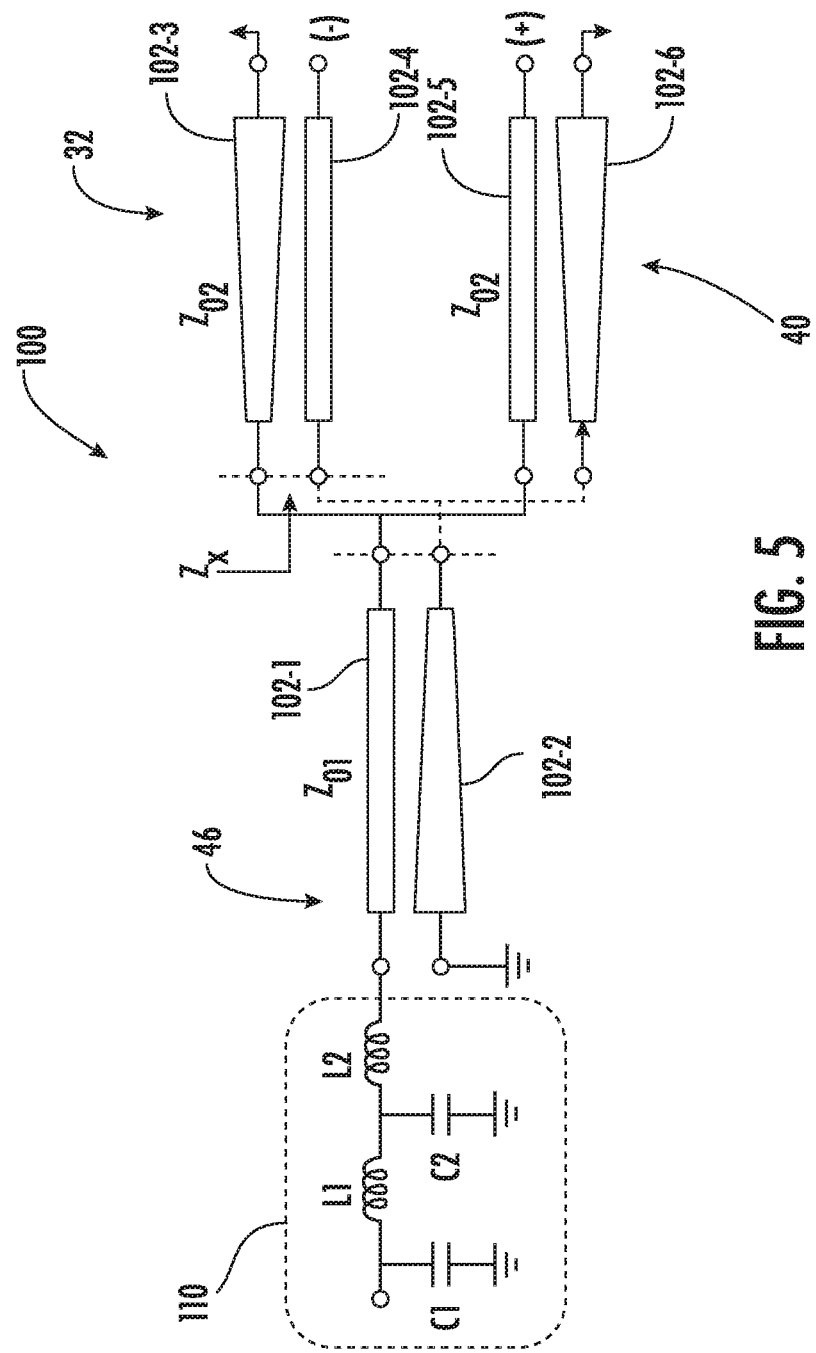
FIG. 5 schematically depicts an equivalent circuit of an example balun network, according to one or more embodiments shown and described herein.

With reference to FIG. 5, a functional block diagram illustrating a circuit 100 representing the balun network 12 is schematically illustrated. By selectively designating an input impedance ($Z_{01}$) associated with the input port 46 and an output impedance ($Z_{02}$) associated with the first output port 32 and the second output port 40, a bandwidth of the balun network 12 may be optimized. In some embodiments, transmission line portions 102-1, 102-2, 102-3, 102-4, 102-5, 102-6 (collectively referred to as transmission line portions 102) of the circuit 100 are quarter-wave impedance transformers at a desired center frequency, and the balun network 12 is terminated with a real impedance at the input port 46, the first output port 32, and the second output port 40. Accordingly, a fractional bandwidth of the balun network 12 may be illustrated using the following non-limiting relations:

$$\frac{\Delta f_o}{f_0} = 2 - \frac{4}{\pi}\cos^{-1}\left(\frac{\Gamma_m}{\sqrt{1-\Gamma_m^2}} * \frac{2*\sqrt{R_x*R_0}}{|R_x - R_0|}\right) \quad (1)$$

$$\frac{\Delta f_i}{f_0} = 2 - \frac{4}{\pi}\cos^{-1}\left(\frac{\Gamma_m}{\sqrt{1-\Gamma_m^2}} * \frac{2*\sqrt{0.5*R_x*R_0}}{|0.5*R_x - R_0|}\right) \quad (2)$$

In the above relations, $\Delta f_o$ is the bandwidth of transmission line portions 102-3, 102-4, 102-5, 102-6, $\Delta f_i$ is the bandwidth of transmission line portions 102-1, 102-2, $f_o$ is the center frequency of the transmission line portions 102, $R_0$ is the real impedance in which the input port 46, the first output port 32, and the second output port 40 are terminated, $R_x$ is a real impedance at an input of the transmission line portions 102-3, 102-4, 102-5, 102-6, and $\Gamma_m$ a maximum value of a reflection coefficient within a desired bandwidth (e.g., −10 dB).

The first relation (1) illustrated above refers to the bandwidth of transmission line portions 102-3, 102-4, 102-5, 102-6, which transform the impedance $R_0$ at the first output port 32 and the second output port 40 into $R_x$. The second relation (2) illustrated above refers to the bandwidth of transmission line portions 102-1, 102-2, which transform the parallel combination of the impedance $R_x$ into the impedance $R_0$. Accordingly, the impedance transformation may be illustrated using the following relation:

$$R_x = \sqrt{2}*R_0 \quad (3)$$

Furthermore, the input impedance ($Z_{01}$) (i.e., the impedances of transmission line portions 102-1, 102-2) and the output impedance ($Z_{02}$) (i.e., the impedances of transmission line portions 102-3, 102-4, 102-5, 102-6) may be illustrated using the following relations:

$$Z_{02} = \sqrt[4]{2} * R_0 \quad (4)$$

$$Z_{01} = \frac{R_0}{\sqrt[4]{2}} \quad (5)$$

As a non-limiting example, if the input port 46, the first output port 32, and the second output port 40 are terminated with a real impedance of 50 Ohms, the real impedance at an input of the transmission line portions 102-3, 102-4, 102-5, 102-6 ($R_x$) is set to 70.71 Ohms, the input impedance ($Z_{01}$) is 42.04 Ohms, and the output impedance ($Z_{02}$) is 59.46 Ohms.

As another non-limiting example, if the input port 46, the first output port 32, and the second output port 40 are terminated with a real impedance of 50 Ohms, the real impedance at an input of the transmission line portions 102-3, 102-4, 102-5, 102-6 ($R_x$) is set to 100 Ohms, the input impedance ($Z_{01}$) is 50 Ohms, and the output impedance ($Z_{02}$) is 70.71 Ohms.

As yet another non-limiting example, if the first output port 32 and the second output port 40 are terminated with a real impedance of 25 Ohms, and the input port 46 is terminated with a real impedance of 50 Ohms, the real impedance at an input of the transmission line portions 102-3, 1024, 102-5, 102-6 ($R_x$) is set to 25 Ohms, the input impedance ($Z_{01}$) is 35.35 Ohms, and the output impedance ($Z_{02}$) is 35.35 Ohms.

In some embodiments, the circuit 100 may include a low pass filter 110, which includes a first inductor ($L_1$), a second inductor ($L_2$), a first capacitor ($C_1$), and a second capacitor ($C_2$). The low pass filter 110 may be implemented by discrete components that are mounted to the dielectric substrate 56 or may be bonded to the dielectric substrate 56 using, for example, a patterned metallization technique. The low pass filter 110 may be electrically connected to the input port 46, and the low pass filter 110 may be able to improve the bandwidth of the balun network 12. In some embodiments, the low pass filter 110 may be removed from the balun network 12. While the illustrated embodiment depicts the low pass filter 110, it should be understood that the circuit 100 may include a high pass filter in some embodiments. Furthermore, while the illustrated embodiment depicts the low pass filter 110 arranged as multiple cascaded filters (i.e., cascaded L-shaped filters), it should be understood that the low pass filter 110 (or high pass filter) may be arranged as a Pi filter, a T filter, and/or the like in some embodiments.

Figure 6:
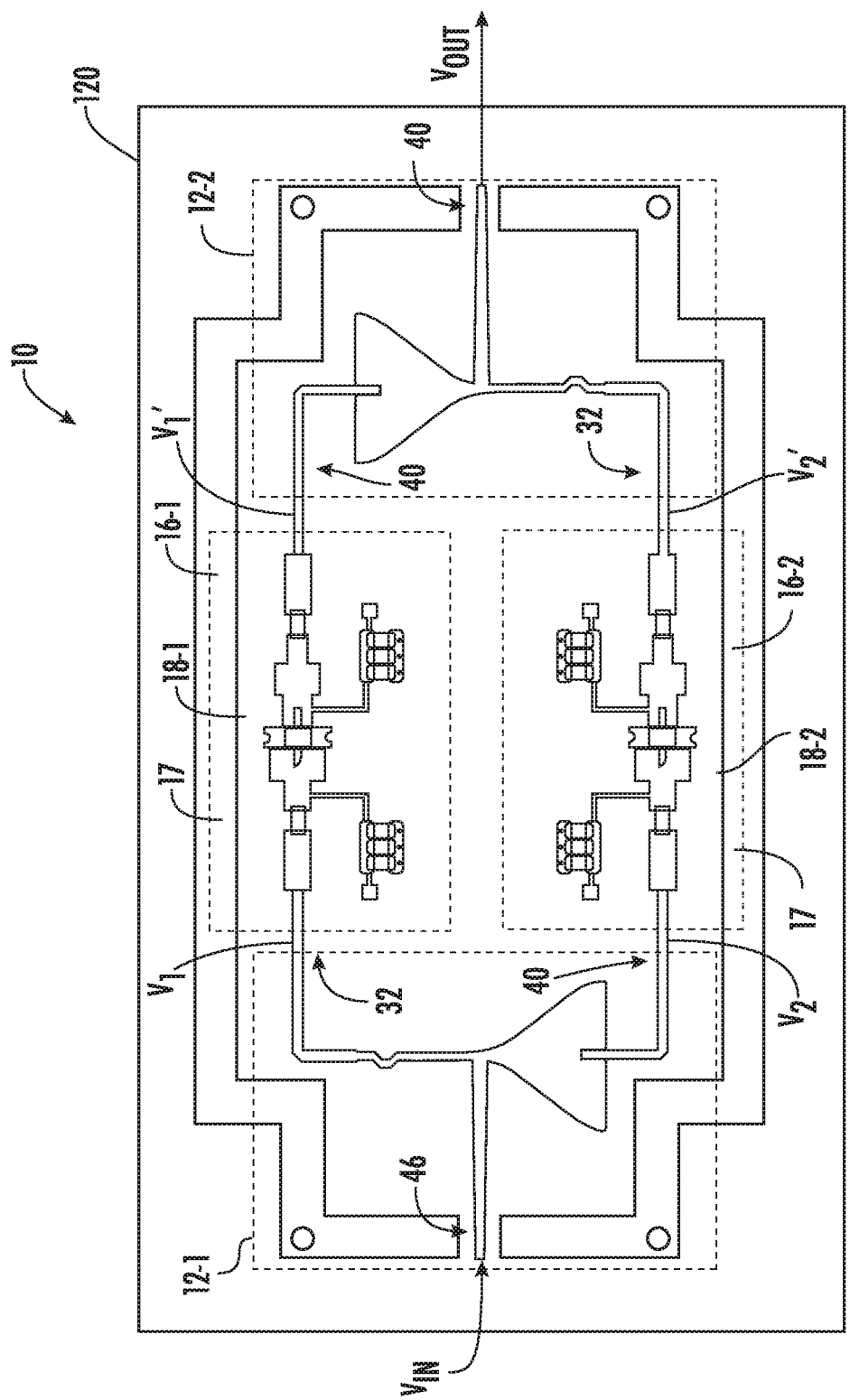
FIG. 6 schematically depicts a functional block diagram of an example amplifier system, according to one or more embodiments shown and described herein.

With reference to FIG. 6, an amplifier system 10 positioned on a printed circuit board (PCB) 120 is schematically depicted. As described above, the amplifier system 10 may include the input balun network 12-1, the output balun network 12-2, the first DC bias supply 16-1, the second DC bias supply 16-2, and the amplifier 17, which includes the first transistor 18-1 and the second transistor 18-2.

As shown in the illustrated embodiment, the input balun network 12-1 may split an RF signal received at the input port 46 of the input balun network 12-1 ($V_{IN}$) into a first signal ($V_1$) and a second signal ($V_2$), which may have approximately the same magnitude and a phase difference of approximately 180°. The first signal ($V_1$) and the second signal ($V_2$) may then be provided to the transistors 18 via the first output port 32 and the second output port 40, respectively. The transistors 18 may amplify the first signal ($V_1$) and the second signal ($V_2$) and output a first amplified signal ($V_1'$) and a second amplified signal ($V_2'$) to the output balun network 12-2. As a non-limiting example, a magnitude of the first amplified signal ($V_1'$) may be at least twice as large as the first signal ($V_1$), and a magnitude of the second amplified signal ($V_2'$) may be at least twice as large as the second signal ($V_2$) (e.g., twice as large, three times as large, etc.). In some embodiments, the DC bias supplies 16 may provide a DC voltage signal to the gate or base terminals and at least one of the source and drain terminals (or collector and emitter terminals) of the transistors 18 such that the transistors 18 are biased around a quiescent operating voltage of the transistors 18, thereby enabling the transistors 18 to amplify the first signal ($V_1$) and the second signal ($V_2$).

In some embodiments, the output balun network 12-2 receives the first amplified signal ($V_1'$) and the second amplified signal ($V_2'$) via the second output port 40 and the first output port 32, respectively, of the output balun network 12-2. By receiving the first amplified signal ($V_1'$) and the second amplified signal ($V_2'$) using the second output port 40 and the first output port 32, the output balun network 12-2 may subsequently combine the first amplified signal ($V_1'$) and the second amplified signal ($V_2'$) into an output signal ($V_{OUT}$), which is subsequently output using input port 46 of the output balun network 12-2. In some embodiments, the output signal ($V_{OUT}$) may have the same magnitude as first amplified signal ($V_1'$) and the second amplified signal ($V_2'$) (i.e., double the power of RF signal received at the input port 46 of the input balun network 12-1 ($V_{IN}$)) and may have a phase difference of approximately 0°. It should be understood that the magnitude of the output signal ($V_{OUT}$) may also be based on a gain of the transistors 17, an impedance of the various ports of the balun networks 12, and/or a voltage value of the RF signal ($V_{IN}$) in some embodiments.

In some embodiments, the nonlinear behavior of the transistors 18 may cause harmonic distortions, thereby generating frequency components that were not originally present within the RF signal ($V_{IN}$) received at the input port of the input balun network 12-1 in some embodiments. As a non-limiting example, the output signal may include odd-order harmonics that distort the output signal ($V_{OUT}$) and therefore reduce the efficiency of the amplifier system 10. As another non-limiting example, the output signal ($V_{OUT}$) may include a number of even-order harmonics. Accordingly, when the CMRR of the balun network 12 is relatively low, the output signal ($V_{OUT}$) may be distorted by the even-order harmonics, thereby reducing the efficiency of the amplifier system 10. As another non-limiting example, the RF signal ($V_{IN}$) may include multiple carriers (e.g. two or more single sinusoidal signals at different frequencies). Due to the nonlinear behavior of the transistors 18, the multiple carriers may be combined to form even-order and odd-order intermodulation (IM) products. The IM products may appear as side lobes in a telecommunication signal and therefore interfere with adjacent telecommunication channels. However, by incorporating the balun networks 12 described herein and selectively designating the shapes and the connections of the ports of the tapered baluns 30 of the balun network 12, the CMRR of the balun network 12 may be increased, thereby suppressing even-order IM products, reducing interference, and improving the efficiency of the amplifier system 10.

As described above, the bandwidth of the amplifier system 10 may be limited in some embodiments. As a non-limiting example, the bandwidth of the amplifier system 10 may be limited to one octave with respect to a center frequency of the amplifier system 10. Accordingly, the efficiency of the amplifier system 10 may decrease when the amplifier system 10 receives RF signals having a center frequency and/or frequency components that are not located within one octave of the center frequency of the amplifier system 10. However, by incorporating the balun networks 12 described herein, the bandwidth of the balun networks 12 and the amplifier system 10 may be sufficient (e.g., 1.5-2.2 octaves) at various center frequencies utilized in wireless communication systems (e.g., LTE telecommunication systems), audio systems, and RF systems while maintaining a low amplitude balance (e.g., 0 dB, 1 dB, 2 dB, etc.), a low phase balance (e.g., 0° deviation from an optimal phase difference, 1° deviation from an optimal phase difference, 2° deviation from an optimal phase difference, etc.), and/or a large CMRR.

Figure 7:
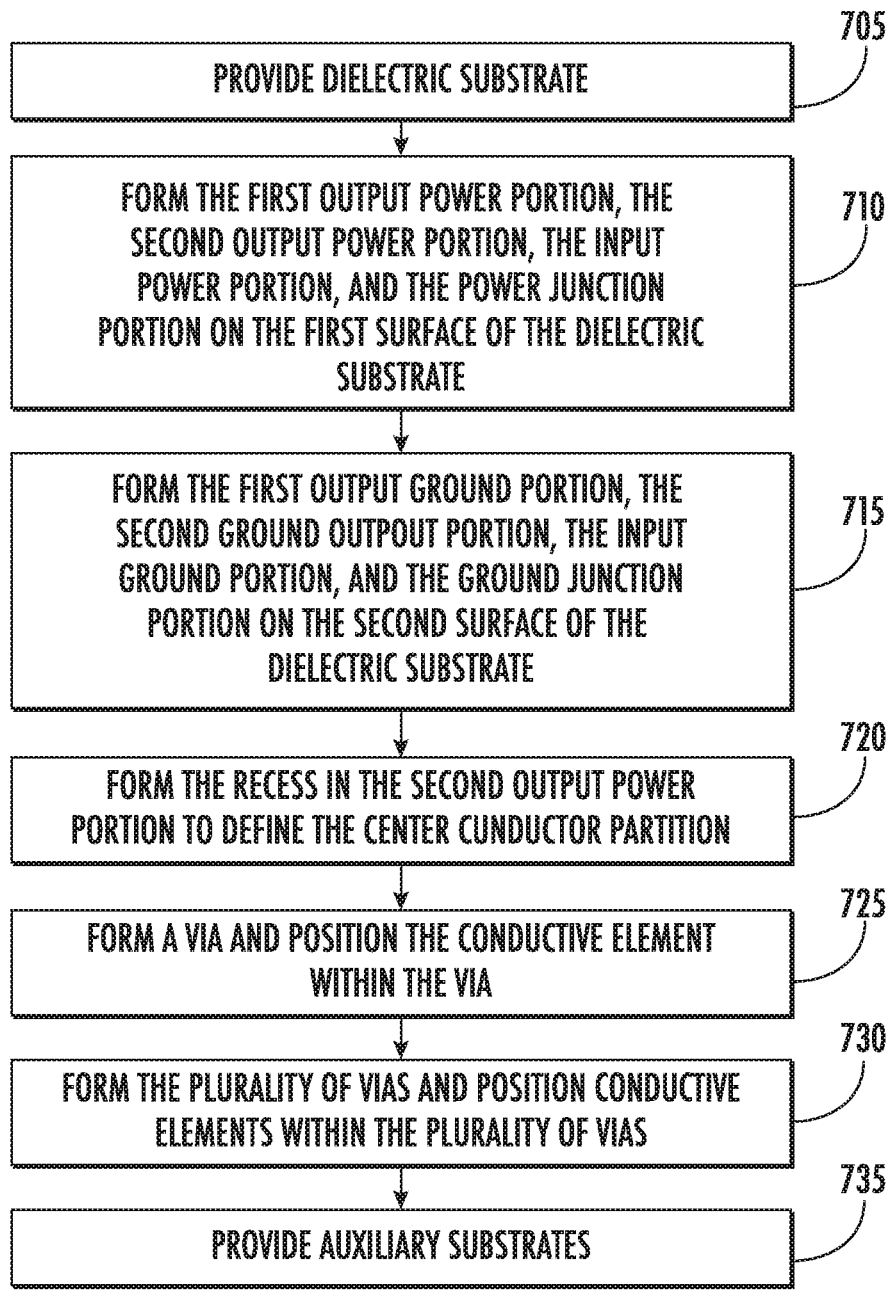
FIG. 7 depicts a flow diagram illustrating an example method of forming a balun network, according to one or more embodiments shown and described herein.

With reference to FIG. 7, a flow diagram illustrating an example method of forming the balun network 12 is illustrated. While the steps shown in FIG. 7 are shown as all occurring and in a particular order, in some embodiments one or more of the steps may not be performed, and in some embodiments, one or more of the steps may be performed in a different order as shown and described herein.

Referring to FIG. 7 in conjunction with FIGS. 4A-4B, at step 705, the dielectric substrate 56 is provided. At step 710, the first output power portion 34, the second output power portion 36, the input power portion 48, and the power junction portion 54 are formed on the first surface 56A of the dielectric substrate 56. At step 715, the first output ground portion 42, the second output ground portion 44, the input ground portion 50, and the ground junction portion 52 are formed on the second surface 56B of the dielectric substrate 56. As a non-limiting example, steps 710 and 715 may be performed using an atomic layer deposition process, chemical vapor deposition, physical vapor deposition, electroless plating, film forming process, gas-metal eutectic bonding process, or other suitable processes.

At step 720, the recess 72 is formed to define the center conductor portion 78 using, for example, mechanical drilling, etching, laser ablation, laser assisted processes, laser damage and etching processes, abrasive blasting, abrasive water jet machining, focused electro-thermal energy, or any other suitable technique.

At step 725, a via is formed within the center conductor portion 78 using, for example, mechanical drilling, etching, laser ablation, laser assisted processes, laser damage and etching processes, abrasive blasting, abrasive water jet machining, focused electro-thermal energy, or any other suitable technique. Furthermore, the conductive element 76 is positioned within the via.

At step 730, the plurality of vias 80 is formed proximate to the edge 60-2 of the second output port 40 using, for example, mechanical drilling, etching, laser ablation, laser assisted processes, laser damage and etching processes, abrasive blasting, abrasive water jet machining, focused electro-thermal energy, or any other suitable technique. Furthermore, the conductive elements 76 are positioned within each via of the plurality of vias 80.

At step 735, auxiliary components, such as a case, are provided proximate to (i.e., near or adjacent to) the first surface 56A and/or the second surface 56B of the dielectric substrate 56 to enclose and/or further reinforce the mechanical robustness of the balun network 12. Additional substrate layers may be included to increase the effective dielectric constant of the dielectric substrate 56.

It should be understood by the above embodiments that the balun networks according to the present disclosure may be selectively positioned on a substrate and may include various geometric characteristics such that the balun networks may have a sufficient bandwidth at various center frequencies utilized in wireless communication systems (e.g., long term evolution (LTE) telecommunication systems), audio systems, and RF systems while maintaining a low amplitude balance (e.g., 0 dB, 1 dB, 2 dB, etc.), a low phase balance (e.g., 0° deviation from an optimal phase difference, 1° deviation from an optimal phase difference, 2° deviation from an optimal phase difference, etc.), and/or a large CMRR. Furthermore, by incorporating single-ended ports in the balun network, the balun network can be easily connected and interfaced with various electronic devices.

It will be apparent to those skilled in the art that various modifications and variations can be made without departing from the spirit or scope of the disclosure. Since modifications, combinations, sub-combinations and variations of the disclosed embodiments incorporating the spirit and substance of the disclosure may occur to persons skilled in the art, the disclosure should be construed to include everything within the scope of the appended claims and their equivalents.

Spatial and functional relationships between elements are described using various terms, including "positioned," "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The invention claimed is:

1. A balun comprising:
 a dielectric substrate defining a first surface and a second surface opposite the first surface;
 a first output port comprising a first output ground portion and a first output power portion;
 a second output port comprising a second output ground portion and a second output power portion; and
 an input port comprising an input ground portion and an input power portion, wherein:
  the first output ground portion, the second output ground portion, and the input ground portion are coupled at a ground junction portion;
  the first output power portion, the second output power portion, and the input power portion are coupled at a power junction portion;
  the first output power portion, the second output power portion, and the input power portion are positioned on the first surface; and
  the first output ground portion, the second output ground portion, and the input ground portion are positioned on the second surface.

2. The balun of claim 1, wherein a width of at least one of the first output ground portion and the second output power portion increases moving from the power junction portion to an edge of the second output port.

3. The balun of claim 1, wherein a width of the input ground portion increases moving from the ground junction portion to an edge of the input port.

4. The balun of claim 1, wherein a width of the input power portion decreases moving from the power junction portion to an edge of the input port.

5. The balun of claim 1, wherein the first output power portion further comprises a protrusion portion extending outward from the first output power portion.

6. The balun of claim 1, further comprising:
 a center conductor portion; and
 a recess, wherein:
  the recess extends through a thickness of the second output port; and
  the center conductor portion is at least partially positioned within the recess.

7. The balun of claim 6, further comprising:
 a via; and
 a conductive element, wherein:
  the via extends through a thickness of the center conductor portion; and
  the conductive element is positioned at least partially within the via.

8. The balun of claim 1, further comprising:
 a plurality of vias; and
 a plurality of conductive elements, wherein:
  the plurality of vias extends through a thickness of the second output port and a thickness of the dielectric substrate; and
  each of the plurality of conductive elements is positioned at least partially within a respective via of the plurality of vias.

9. An amplifier system comprising:
 an amplifier; and a balun, wherein the balun comprises a dielectric substrate defining a first surface and a second surface opposite the first surface, a first output port, a second output port, and an input port, and wherein:
- the first output port comprises a first output ground portion and a first output power portion;
- the second output port comprises a second output ground portion and a second output power portion;
- the input port comprises an input ground portion and an input power portion;
- the first output ground portion, the second output ground portion, and the input ground portion are coupled at a ground junction portion;
- the first output power portion, the second output power portion, and the input power portion are coupled at a power junction portion;
- the first output power portion, the second output power portion, and the input power portion are positioned on the first surface; and
- the first output ground portion, the second output ground portion, and the input ground portion are positioned on the second surface.

10. The amplifier system of claim 9, wherein a width of at least one of the first output power portion and the second output power portion increases moving from the power junction portion to an edge of the second output port.

11. The amplifier system of claim 9, wherein a width of the input ground portion increases moving from the ground junction portion to an edge of the input port.

12. The amplifier system of claim 9, wherein a width of the input power portion decreases moving from the power junction portion to an edge of the input port.

13. The amplifier system of claim 9, wherein the first output power portion further comprises a protrusion portion extending outward from a centerline of the first output power portion.

14. The amplifier system of claim 9, further comprising:
a center conductor portion; and
a recess, wherein:
- the recess extends through a thickness of the second output port; and
- the center conductor portion is at least partially positioned within the recess.

15. The amplifier system of claim 14, further comprising:
a via; and
a conductive element, wherein:
- the via extends through a thickness of the center conductor portion; and
- the conductive element is positioned at least partially within the via.

16. The amplifier system of claim 9, further comprising:
a plurality of vias; and
a plurality of conductive elements, wherein:
- the plurality of vias extend through a thickness of the second output port and a thickness of the dielectric substrate; and
- each of the plurality of conductive elements is positioned at least partially within a respective via of the plurality of vias.

17. The amplifier system of claim 9, wherein the amplifier includes a direct current (DC) bias supply and a transistor.

18. A method of forming a balun, the method comprising:
forming a first output power portion, a second output power portion, an input power portion, and a power junction portion on a first surface of a dielectric substrate comprising the first surface and a second surface positioned opposite the first surface, wherein the power junction couples the first output power portion, the second output power portion, and the input power portion; and
forming a first output ground portion, a second output ground portion, an input ground portion, and a ground junction portion on the second surface, wherein the ground junction portion couples the first output ground portion, the second output ground portion, and the input ground portion, wherein:
- a width of the second output power portion increases from the power junction portion to an edge of the second output power portion;
- a width of the first output ground portion increases from the ground junction portion to an edge of the first output ground portion; and
- a width of the input ground portion increases from the ground junction portion to an edge of the input ground portion.

19. The method of claim 18, further comprising:
forming a recess, wherein the recess extends through a thickness of the second output power portion; and
positioning a center conductor portion within the recess.

20. The method of claim 19, further comprising:
forming a via, wherein the via extends through a thickness of the center conductor portion; and
positioning a conductive element within the via.

21. The method of claim 18, further comprising:
forming a plurality of vias; and
positioning a plurality of conductive elements within the plurality of vias, wherein each of the plurality of conductive elements is positioned within a respective via of the plurality of vias.

* * * * *